(12) United States Patent
Beall et al.

(10) Patent No.: US 7,623,344 B2
(45) Date of Patent: Nov. 24, 2009

(54) METHOD AND APPARATUS FOR MOUNTING A FAN IN A CHASSIS

(75) Inventors: Christopher Beall, Pflugerville, TX (US); Alex Z. Rodriguez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 500 days.

(21) Appl. No.: 11/199,725

(22) Filed: Aug. 9, 2005

(65) Prior Publication Data

US 2007/0035923 A1 Feb. 15, 2007

(51) Int. Cl.
*G06F 1/20* (2006.01)

(52) U.S. Cl. .................... 361/679.48; 361/695; 454/184

(58) Field of Classification Search ................. 361/687, 361/695; 454/184
See application file for complete search history.

(56) References Cited

U.S. PATENT DOCUMENTS

| | | | | | |
|---|---|---|---|---|---|
| 4,744,005 | A | * | 5/1988 | Milani .......................... | 361/687 |
| 5,562,410 | A | * | 10/1996 | Sachs et al. .............. | 415/213.1 |
| 6,002,586 | A | * | 12/1999 | Chen et al. ................... | 361/695 |
| 6,322,042 | B1 | * | 11/2001 | Nemec ......................... | 248/694 |
| 6,373,698 | B1 | * | 4/2002 | Christensen ................ | 361/695 |
| 6,375,440 | B2 | * | 4/2002 | Kosugi .................. | 417/423.14 |
| 6,414,845 | B2 | * | 7/2002 | Bonet .......................... | 361/695 |
| 6,556,437 | B1 | * | 4/2003 | Hardin ........................ | 361/687 |
| 6,603,661 | B2 | | 8/2003 | Smith et al. | |
| 6,674,641 | B2 | * | 1/2004 | Jensen et al. ................. | 361/687 |
| 6,711,013 | B2 | | 3/2004 | Wobig et al. | |
| 6,714,411 | B2 | | 3/2004 | Thompson et al. | |
| 6,722,971 | B2 | | 4/2004 | Gough | |
| 6,795,314 | B1 | * | 9/2004 | Arbogast et al. ............. | 361/695 |
| 6,817,939 | B2 | * | 11/2004 | Gan et al. .................... | 454/184 |
| 6,839,233 | B2 | * | 1/2005 | Cravens et al. .............. | 361/695 |
| 6,865,078 | B1 | * | 3/2005 | Chang ......................... | 361/695 |
| 6,980,435 | B2 | * | 12/2005 | Shum et al. ................. | 361/695 |
| 6,999,313 | B2 | * | 2/2006 | Shih ........................... | 361/695 |
| 7,009,841 | B2 | * | 3/2006 | Chen et al. ................... | 361/695 |
| 7,035,102 | B2 | * | 4/2006 | Holmes et al. .............. | 361/695 |
| 7,054,155 | B1 | * | 5/2006 | Mease et al. ................ | 361/695 |
| 7,236,361 | B2 | * | 6/2007 | Cote et al. ................... | 361/695 |
| 7,259,962 | B2 | * | 8/2007 | Chen ........................... | 361/695 |
| 7,312,989 | B2 | * | 12/2007 | Chen ........................... | 361/695 |
| 2001/0024358 | A1 | * | 9/2001 | Bonet ......................... | 361/695 |
| 2004/0130872 | A1 | * | 7/2004 | Cravens et al. .............. | 361/695 |
| 2004/0184234 | A1 | * | 9/2004 | Kosugi ........................ | 361/695 |
| 2005/0227608 | A1 | * | 10/2005 | Wu et al. ..................... | 454/184 |
| 2005/0280990 | A1 | * | 12/2005 | Goodenough et al. ........ | 361/695 |
| 2007/0135033 | A1 | * | 6/2007 | Kao et al. .................... | 454/184 |

* cited by examiner

*Primary Examiner*—Lisa Lea-Edmonds
(74) *Attorney, Agent, or Firm*—Haynes and Boone, LLP (57) ABSTRACT

A fan mounting apparatus includes a base having a fan support. An elongated handle extends from the base for positioning the base in a chassis. A securing member is located adjacent a distal end of the elongated handle for securing the base in a chassis. The fan mounting apparatus may be used to couple and secure a fan module in a channel defined by a chassis by using the elongated handle to position the fan module in the chassis and secure the fan module to the chassis.

5 Claims, 14 Drawing Sheets

METHOD AND APPARATUS FOR MOUNTING A FAN IN A CHASSIS

BACKGROUND

The present disclosure relates generally to information handling systems, and more particularly to mounting a fan in an information handling system chassis.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems include a chassis which is densely packed with the components of the information handling system. The dense packing of the components in the chassis can sometimes raise issues with respect to the installation and removal of some of the removable components in the system.

For example, some information handling systems chassis include a board at the bottom of the chassis with a plurality of processors on the board. Different components may be stacked up around the processors in the chassis such that only a relatively narrow channel exists to allow the processor heat sink fans to be installed adjacent the processor heat sinks. This narrow channel creates visual issues with regards to identifying the correct orientation to mount the fan and plug it in, issues with regard to the user contacting the surrounding components including electrical or mechanical parts, and ergonomic issues with regard to the strain a user experiences when trying to install the fans.

Conventional solutions to fan mounting issues have focused on reducing the size of the mounting apparatus. Reducing the mounting apparatus size does nothing to address the problems above.

Accordingly, it would be desirable to provide for mounting a fan in a chassis absent the disadvantages found in the prior methods discussed above.

SUMMARY

According to one embodiment, a fan mounting apparatus is provided which includes a base having a fan support, an elongated handle extending from the base for positioning the base in a chassis, and a securing member located adjacent a distal end of the elongated handle for securing the base in a chassis.

BRIEF DESCRIPTION OF THE DRAWINGS

FIG. 2b is a rear perspective view illustrating an embodiment of the fan mounting apparatus of FIG. 2a.

FIG. 4b is a top view illustrating an embodiment of the first fan positioning feature of FIG. 4a.

FIG. 5 is a perspective view illustrating an embodiment of a second fan positioning feature used with the fan mounting apparatus of FIG. 2a, the fan module of FIG. 3, and the first fan positioning feature of FIG. 4a.

FIG. 6b is a cut away perspective view illustrating an embodiment of the chassis of FIG. 6a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
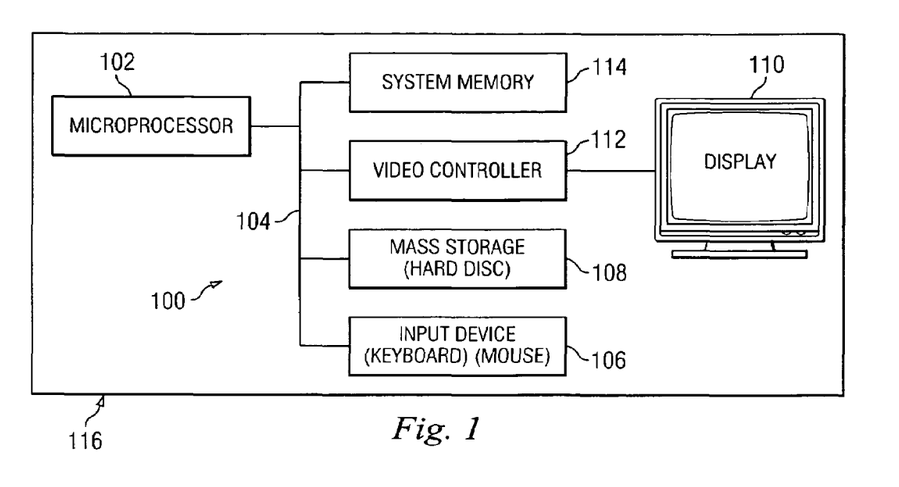
FIG. 1 is a schematic view illustrating an embodiment of an information handling system.

In one embodiment, information handling system 100, FIG. 1, includes a microprocessor 102, which is connected to a bus 104. Bus 104 serves as a connection between microprocessor 102 and other components of computer system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. Information handling system 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of information handling system 100. It should be understood that other buses and intermediate circuits can be deployed between the components described above and microprocessor 102 to facilitate interconnection between the components and the microprocessor.

Figure 2A:
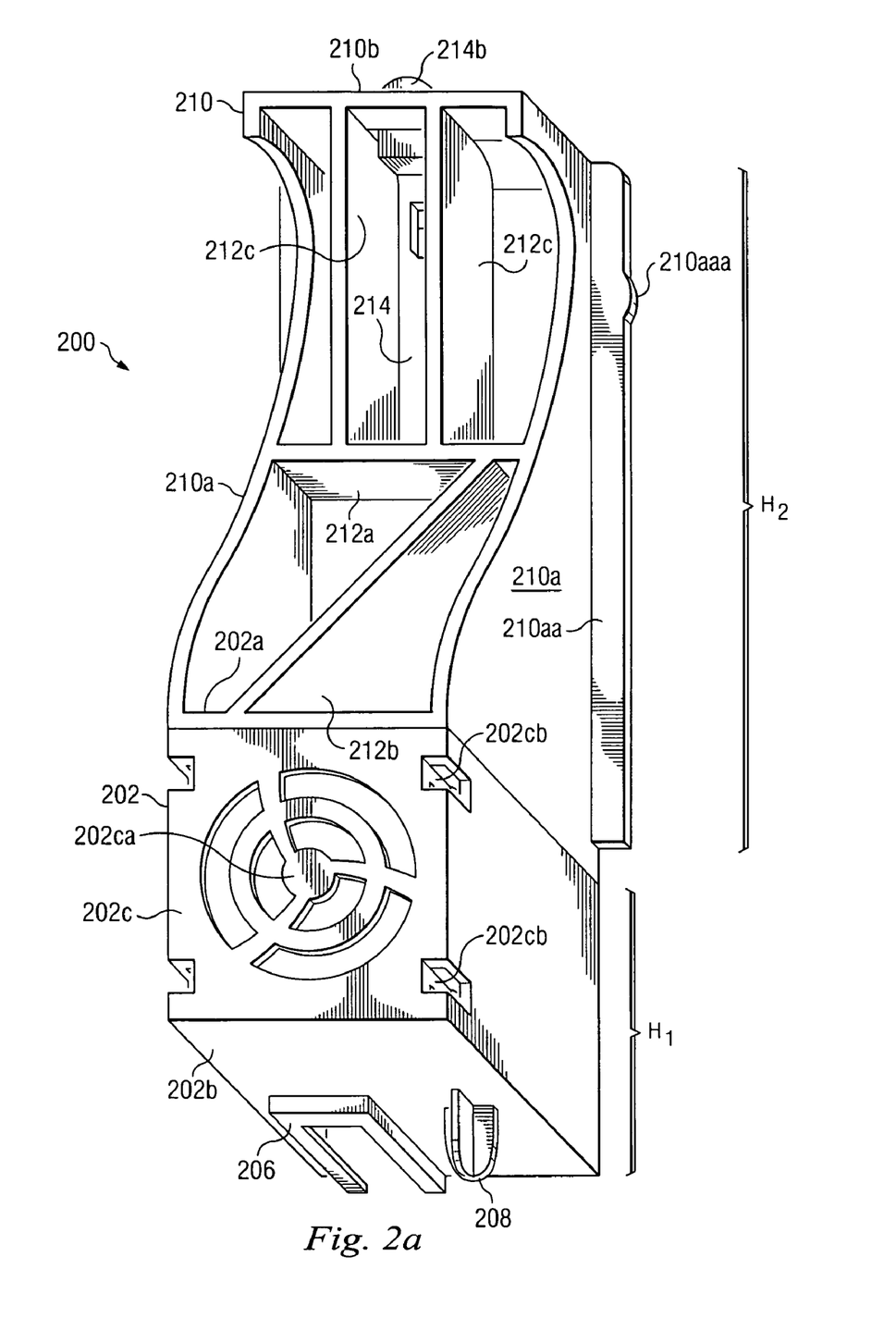
FIG. 2a is a front perspective view illustrating an embodiment of a fan mounting apparatus.
Figure 2B:
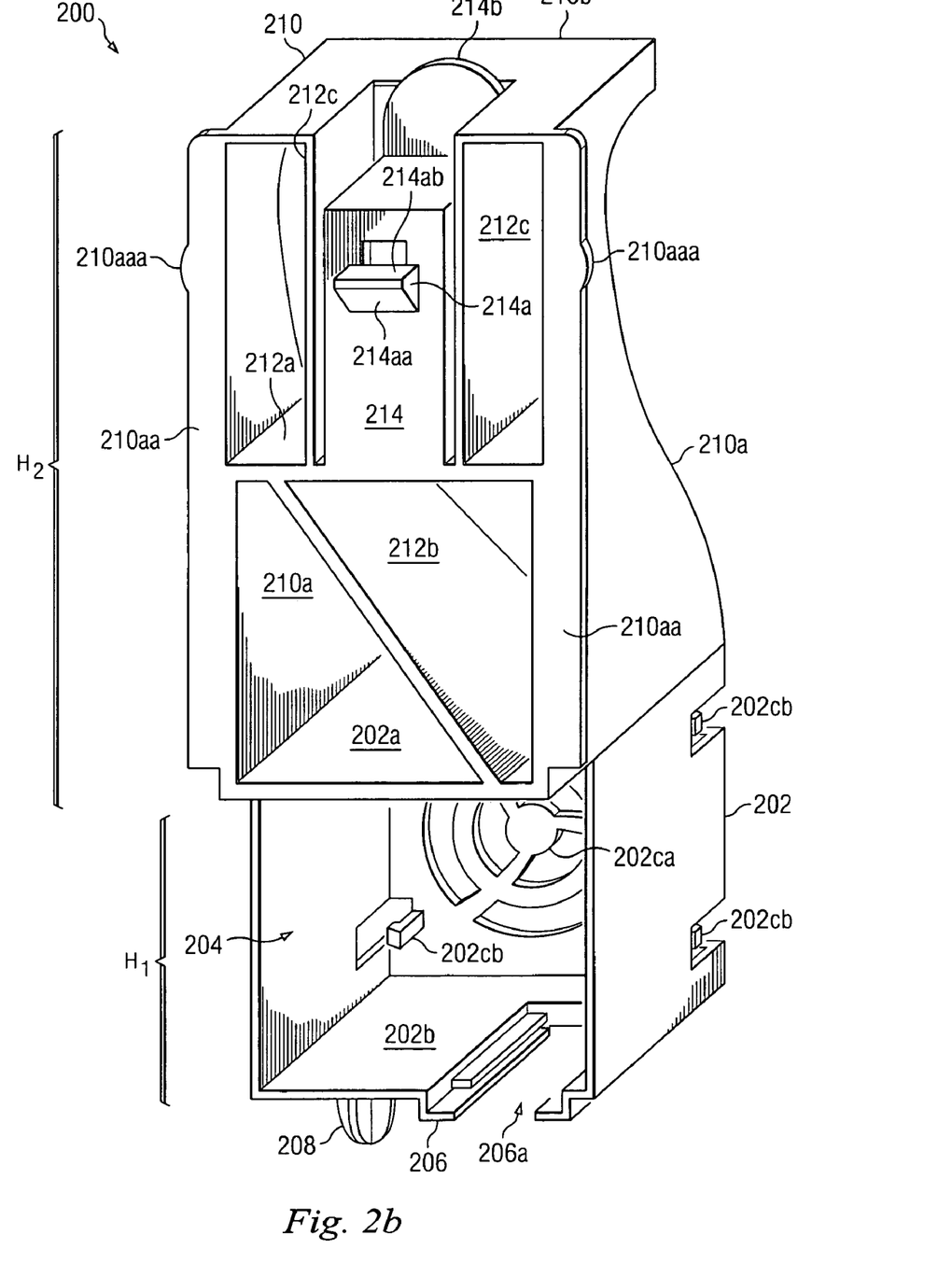

Referring now to FIGS. 2a and 2b, a fan mounting apparatus 200 is illustrated. The fan mounting apparatus 200 includes a base 202 having a top surface 202a, a bottom surface 202b located opposite the top surface 202a, and a front surface 202c extending between the top surface 202a and the bottom surface 202b. A fan support slot 204 is defined by the base 202 between the top surface 202a, the bottom surface 202b, and the front wall 202c. The front wall 202c defines an airflow passageway 202ca extending through the front wall 202c to the fan support slot 204. A plurality of fan couplers 202cb extend from the front wall 202c into the fan support channel 204 and are located in a spaced apart relationship at the corners of the front wall 202c. A plug coupler 206 is located on the bottom surface 202b of the base 202 and defines a plug slot 206a along its length. An alignment member 208 extends from the bottom surface 202b and is located adjacent the plug coupler 206b. A height $H_1$ of the base 202 is approximately equal to the height of the fan support slot 204.

An elongated handle 210 extends vertically from the top surface 202a of the base 202 and includes a pair of arms 210a which extend from the top surface 202a of the base 202 in a substantially parallel and spaced apart relationship and which connect together on a distal end 210b of the elongated handle 210. A height $H_2$ of the elongated handle 210 is approximately equal to the height of the arms 210a and, in an embodiment, is greater than the height $H_1$ of the base 202. A guide member 210aa extends from each arm 210a and includes an interference fit member 210aaa extending from the guide member 210aa and located along its length. A structural beam 212a extends between the arms 210a. A structural beam 212b extends between the structural beam 212a and the top surface 202a of the base 202. A pair of structural beams 212c extend between the distal end 210b of the handle 210 and the structural beam 212a in a substantially parallel and spaced apart relationship. A securing member 214 extends from the structural beam 212a and is located between the structural beams 212c and adjacent the distal end 210b of the handle 210. The securing member 214 includes a locking member 214a extending from the securing member 214 and having a beveled surface 214aa and a locking surface 214ab. A release tab 214b is located on a distal end of the securing member 214 and is positioned immediately adjacent the distal end 210b of the handle 210.

Figure 3:
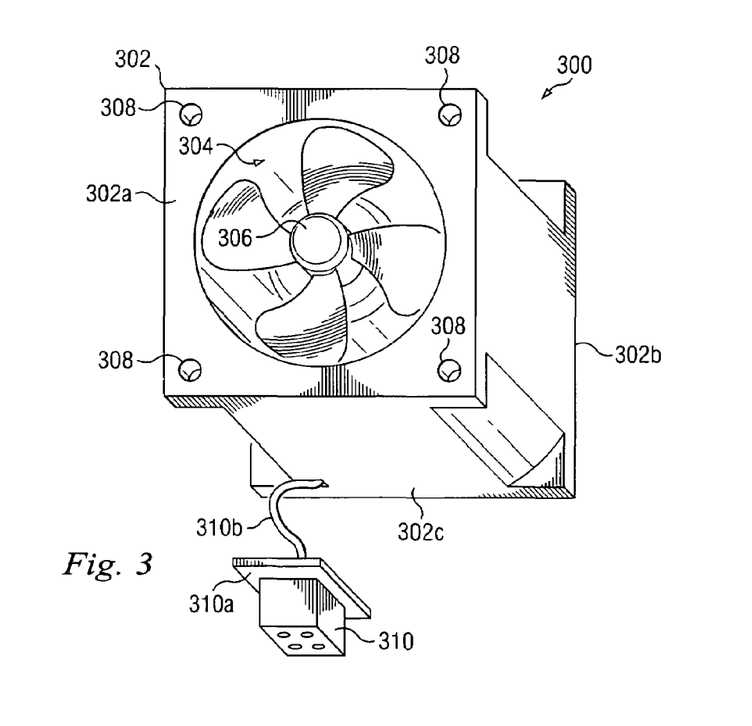
FIG. 3 is a perspective view illustrating an embodiment of a fan module used with the fan mounting apparatus of FIGS. 2a and 2b.

Referring now to FIG. 3, a fan module 300 is illustrated. The fan module 300 includes a base 302 having a front surface 302a, a rear surface 302b located opposite the front surface 302a, and a bottom surface 302c extending between the front surface 302a and the rear surface 302b. A fan aperture 304 is defined by the base 302 and extends through the base 302 from the front surface 302a to the rear surface 302b. A fan 306 is located in the fan aperture 304. A plurality of coupling apertures 308 are defined by the base 302 and positioned in a spaced apart relationship on the corners of the front surface 302a. A fan plug 310 includes a plug mount 310a and is coupled to the base 302 by a wire 310b extending from the bottom surface 302c of the base 302.

Figure 4A:
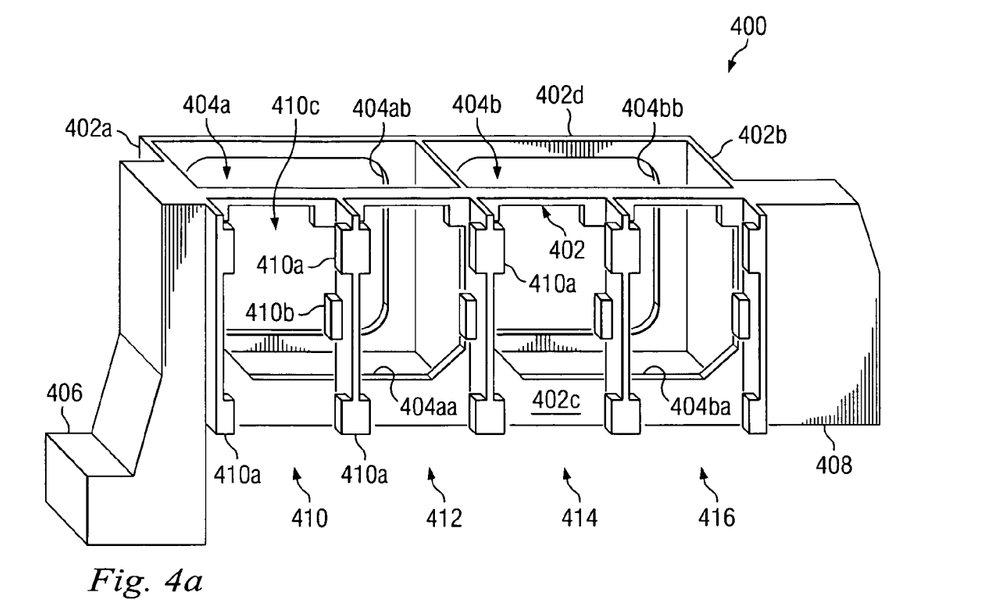
FIG. 4a is a perspective view illustrating an embodiment of a first fan positioning feature used with the fan mounting apparatus of FIG. 2a and the fan module of FIG. 3.
Figure 4B:
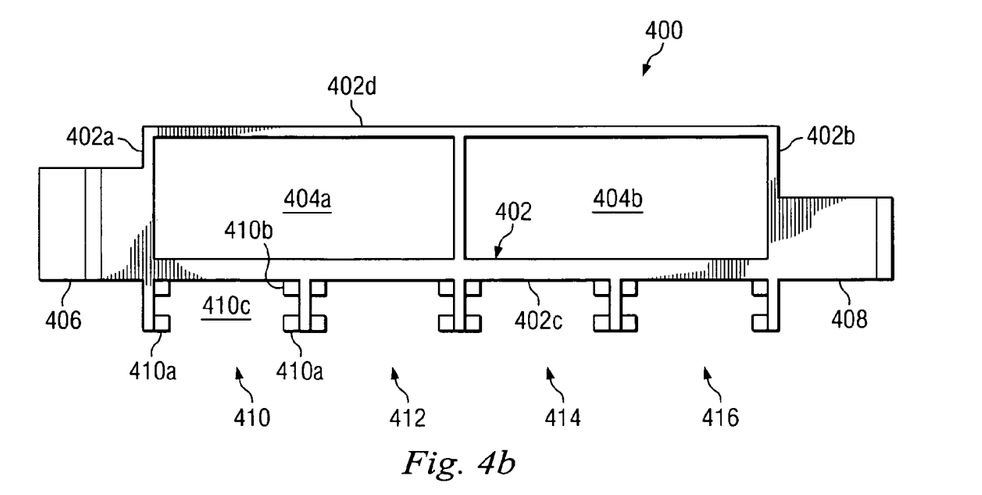

Referring now to FIGS. 4a and 4b, a first fan positioning feature 400 is illustrated. First fan positioning feature 400 includes a base 402 having a pair of opposing ends 402a and 402b, a front surface 402c which extends between the ends 402a and 402b, and a rear surface 402d which is located opposite the front surface 402c and extends between the ends 402a and 402b. A pair of large fan slots 404a and 404b are defined by the base 402 and located adjacent each other. A plurality of airflow passageways 404aa and 404aa are defined by the base 402 and extend through the front surface 402c to the large fan slots 404a and 404a, and a plurality of airflow passageways 404ab and 404ab are defined by the base 402 and extend through the rear surface 402d from the large fan slots 404a and 404a. A support leg 406 extends from the distal end 402a of the base 402. A support beam 408 extends from the distal end 402b of the base 402. A fan guide feature 410 is located on the front surface 402c of the base 402 and includes a plurality of guide beams 410a and 410b which define a guide channel 410c between them. A plurality of fan guide features 412, 414, and 416 also extend from the front surface 402a of the base 402, each substantially similar to the fan guide feature 410 and each including corresponding guide beams and defining corresponding guide channels.

Figure 5:
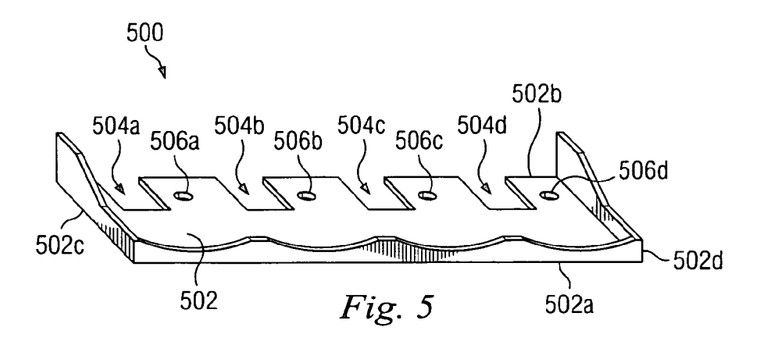

Referring now to FIG. 5, a second fan positioning feature 500 is illustrated. Second fan positioning feature 500 includes an elongated base 502 having a front edge 502a, a rear edge 502b located opposite the front edge 502a, and a plurality of opposing side edges 502c and 502d extending between the front edge 502 and the rear edge 502b. A plurality of plug channels 504a, 504a, 504c, and 504d are defined by the base 502 and located in a spaced apart relationship on the base 502 and adjacent the rear edge 502b. A plurality of fan alignment apertures 506a, 506b, 506c, and 506d are defined by the base 502 and located adjacent the plug channels 504a, 504a, 504c, and 504d, respectively.

Figure 6A:
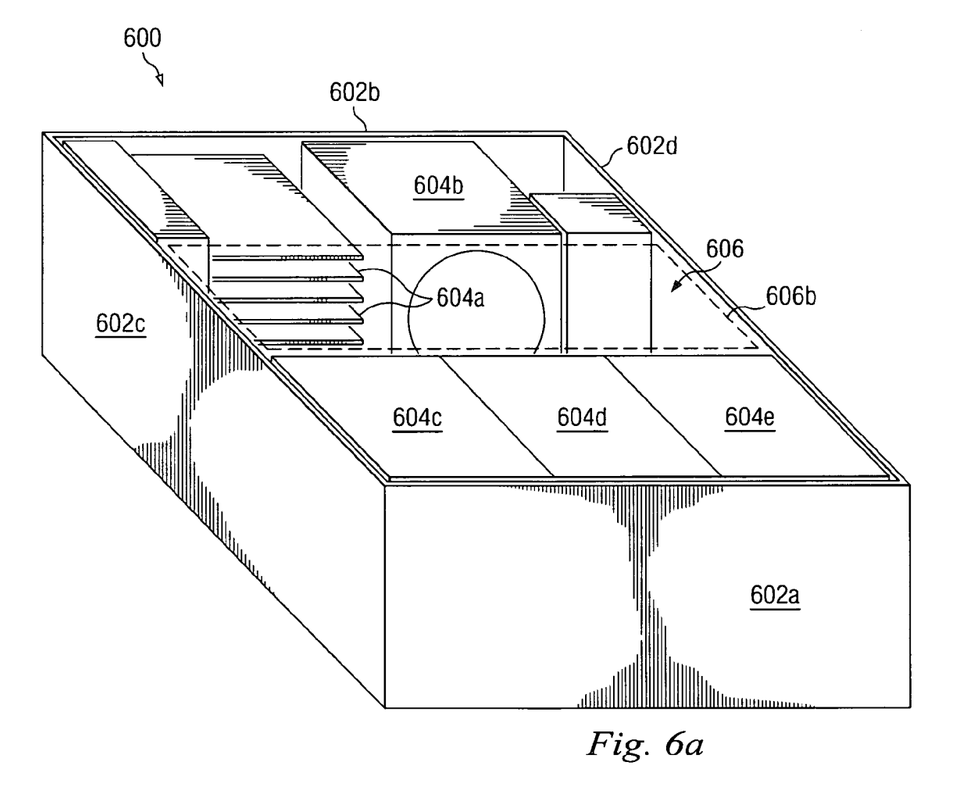
FIG. 6a is a perspective view illustrating an embodiment of a chassis used with the fan mounting apparatus of FIG. 2a, the fan module of FIG. 3, the first fan positioning feature of FIG. 4a, and the second fan positioning feature of FIG. 5.
Figure 6B:
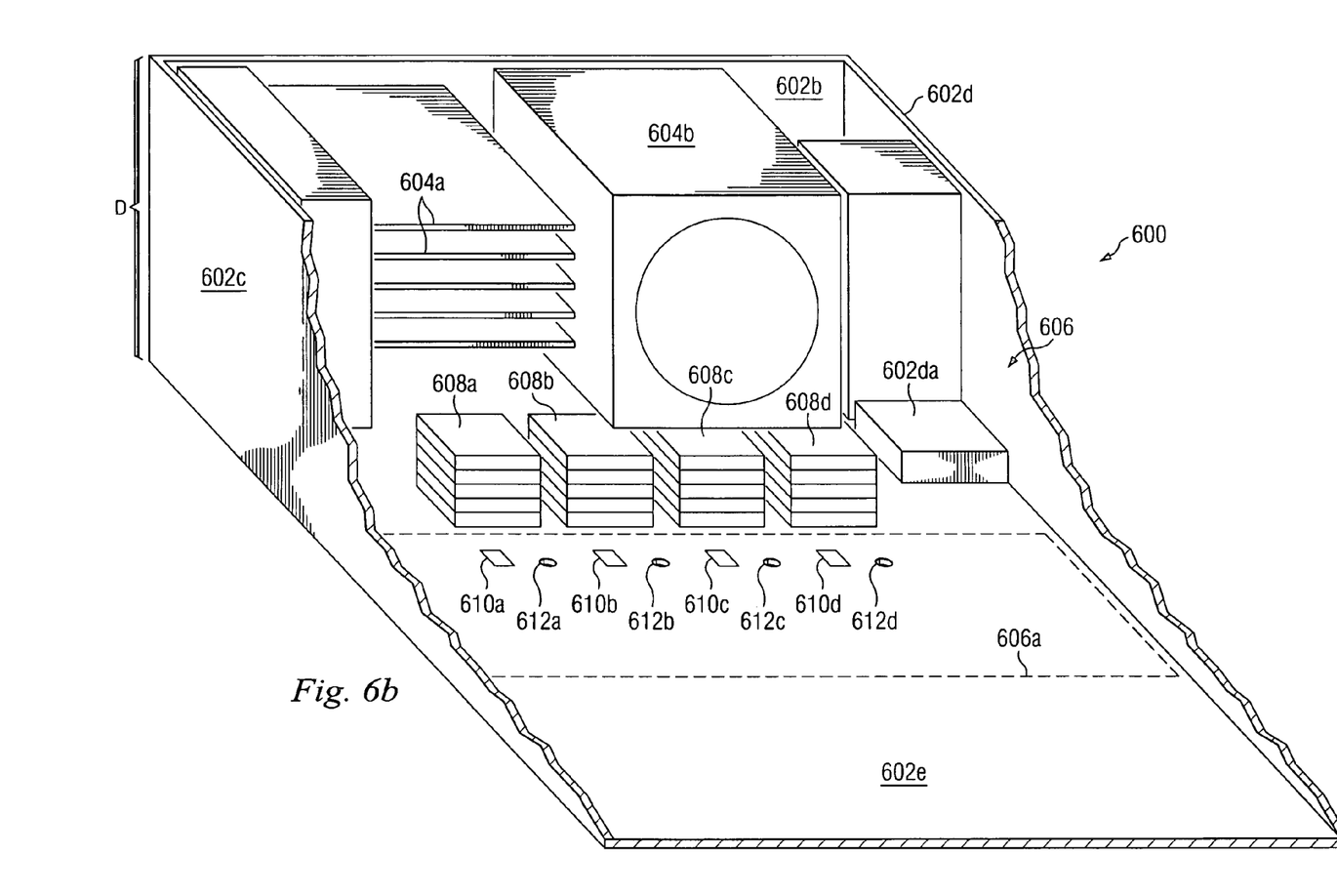

Referring now to FIGS. 6a and 6b, a chassis 600 is illustrated. The chassis 600 includes a front wall 602a, a rear wall 602b located opposite the front wall 602a, a pair of side walls 602c and 602d extending between the front wall 602a and the rear wall 602b, and a base 602e extending between the edge of the front wall 602a, the rear wall 602b, and the side walls 602c and 602d. A support 602da extends from a substantially central location on the side wall 602d adjacent the base 602e. In an embodiment, the chassis 600 may be the chassis 116, described above with reference to FIG. 1, and may house some or all of the components of the information handling system 100, described above with reference to FIG. 1. In an embodiment, the base 602e may include a board such as, for example, a motherboard, mounted on its surface. A plurality of information handling system components 604a and 604a are positioned in the chassis 600 and located adjacent the rear wall 602b. A plurality of information handling system components 604c, 604d, and 604e are also positioned in the chassis 600 and located adjacent the front wall 602a. The information handling system components 604a, 604a, 604c, 604d, and 604e, and the side walls 602c and 602d define a fan channel 606 located between them having channel bottom 606a adjacent the base 602e and a channel entrance 606b adjacent the upper edge of the chassis 600 and the information handling system components 604a, 604a, 604c, 604d, and 604e. In an embodiment, the fan channel 606 includes a depth D measured from the channel entrance 606b to the channel bottom 606a. A plurality of heat sinks 608a, 608b, 608c, and 608d are mounted to the base 602e, positioned adjacent each other, and located beneath the information handling system components 604a and 604a and adjacent the fan channel 606. In an embodiment, the heat sinks 608a, 608b, 608c, and 608d may be coupled to a plurality of processors (not shown) such as, for example, the microprocessor 102 described above with reference to FIG. 1. A plurality of fan sockets 610a, 610b, 610c, and 610d are located on the base 602e and positioned in a spaced apart relationship adjacent the heat sinks 608a, 608b, 608c, and 608d, respectively. A plurality of alignment apertures 612a, 612b, 612c, and 612d are defined by the base 602e and located adjacent the fan sockets 610a, 610b, 610c, and 610d, respectively.

Figures 7A, 7C:
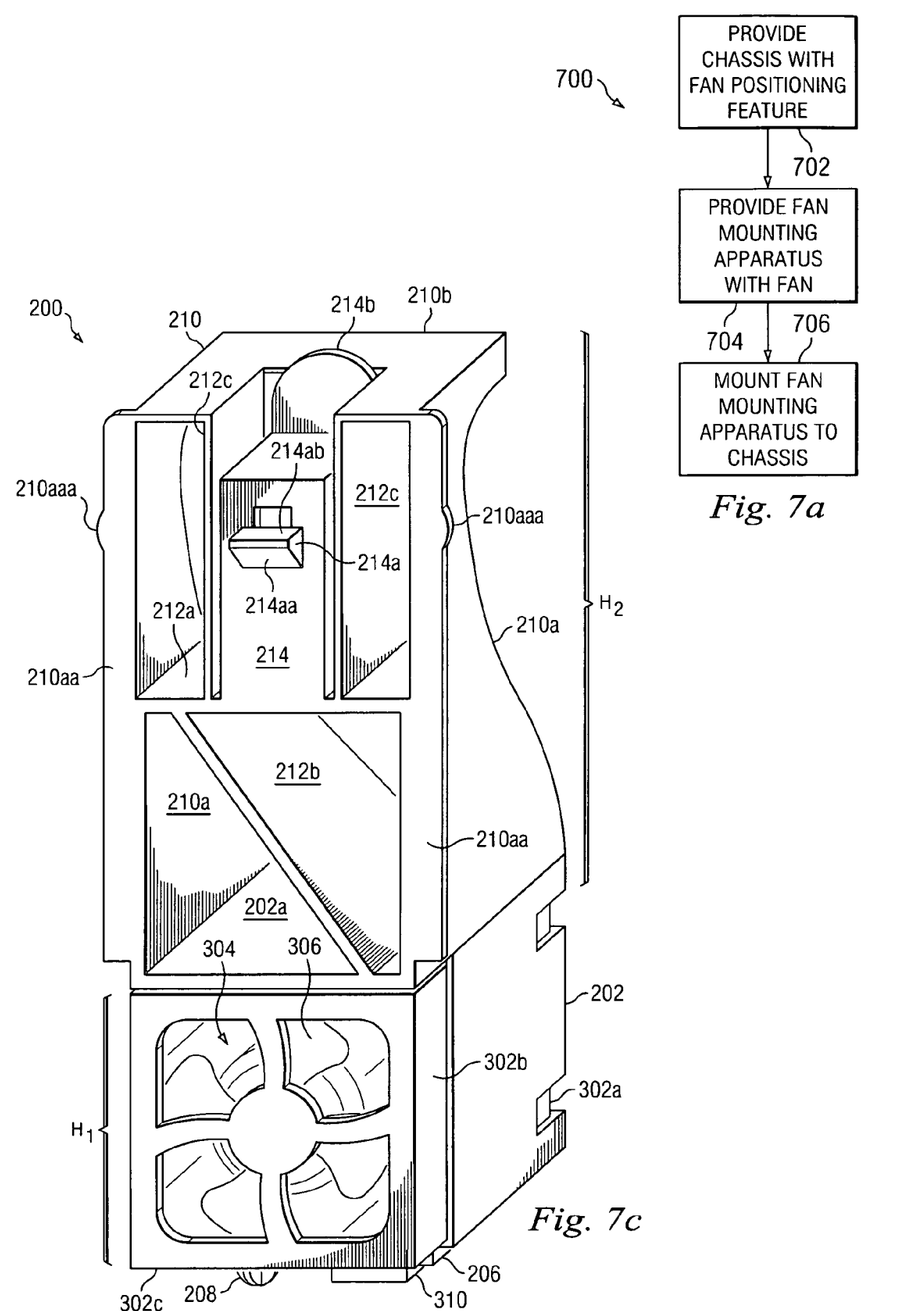
FIG. 7a is a flow chart illustrating an embodiment of a method for mounting a fan in a chassis.
FIG. 7c is a rear perspective view illustrating an embodiment of the fan module of FIG. 3 positioned in the fan mounting apparatus of FIG. 2b.
Figure 7B:
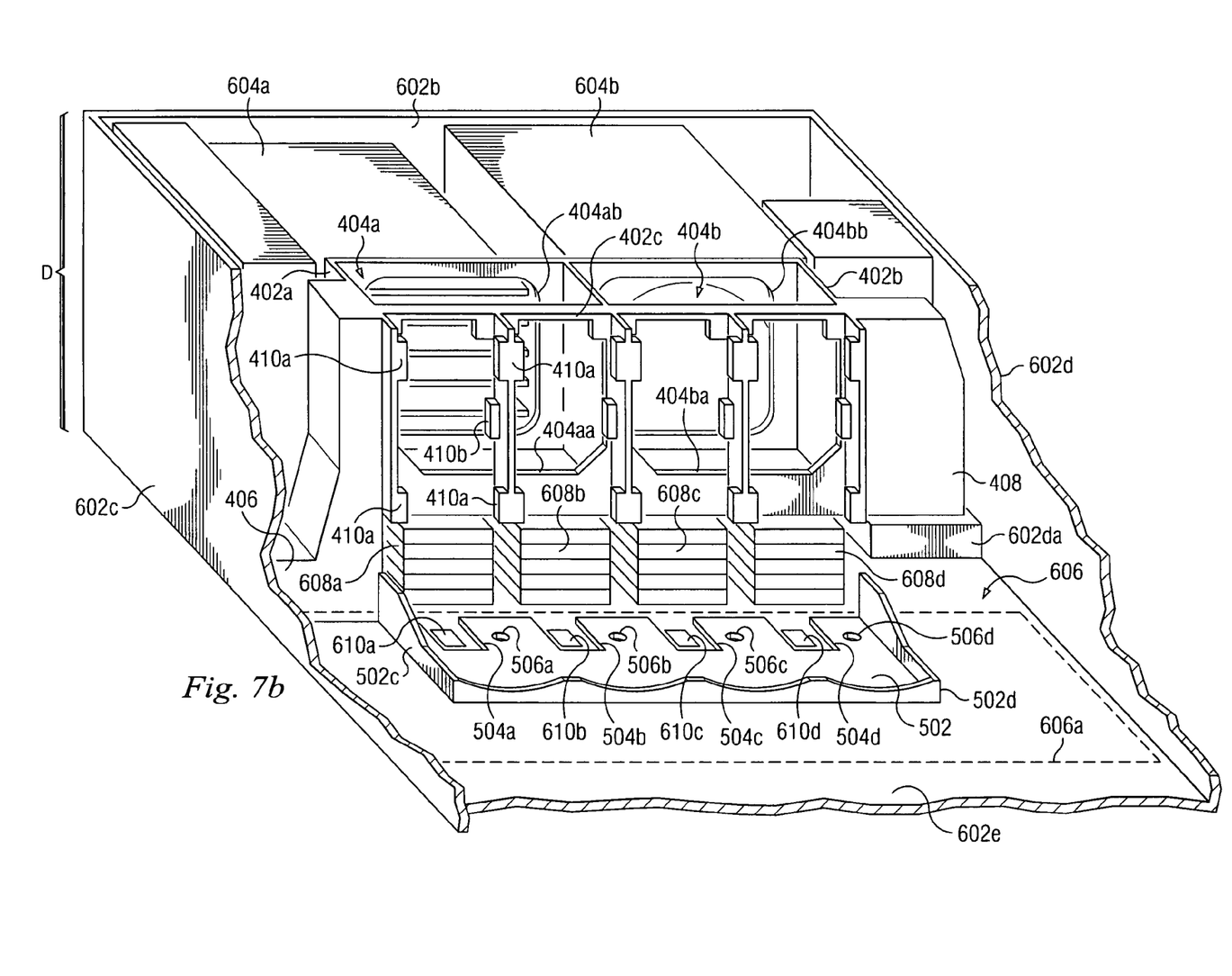
FIG. 7b is a perspective view illustrating an embodiment of the first fan positioning feature of FIG. 4a and the second fan positioning feature of FIG. 5 mounted to the chassis of FIG. 6.

Referring now to FIGS. 4a, 4a, 5, 6a, 6b, 7a, and 7b, a method 700 for mounting a fan in a chassis is illustrated. The method 700 begins at step 702 where the chassis 600 with a fan positioning feature is provided. The first fan positioning feature 400 is positioned in the chassis 600 such that the support leg 406 is adjacent the side wall 602c, the support beam 408 is adjacent the side wall 602d, and the first fan positioning feature 400 is located in the fan channel 606 adjacent the information handling system components 604a and 604a, as illustrated in FIG. 7b. The support leg 406 may then be mounted to the base 602e and the support beam 408 may be mounted to the support 602da using conventional methods known in the art. In an embodiment, the first fan positioning feature 400 may include large system fans (not shown) positioned in the large fan slots 404a and 404a for cooling of the information handling system components 604a and 604a. The second fan positioning feature 500 is then positioned in the chassis 600 such that the side edge 502c is adjacent the side wall 602c, the side edge 502d is adjacent the side wall 602d, the back edge 502b is adjacent the first fan positioning feature 400, the fan sockets 610a, 610b, 610c and 610d are located adjacent the plug channels 504a, 504a, 504c, and 504d, and the fan alignment apertures 506a, 506b, 506c, and 506d on second fan positioning feature 500 are adjacent the alignment apertures 612a, 612b, 612c, and 612d, respectively, on the base 602e, as illustrated in FIG. 7b. The second fan positioning feature 500 may then be mounted to the base 602e of the chassis 600 using conventional methods known in the art. In an embodiment, the first fan positioning feature 400 and the second fan positioning feature 500 provide a fan positioning feature in the chassis 600.

Figure 7D:
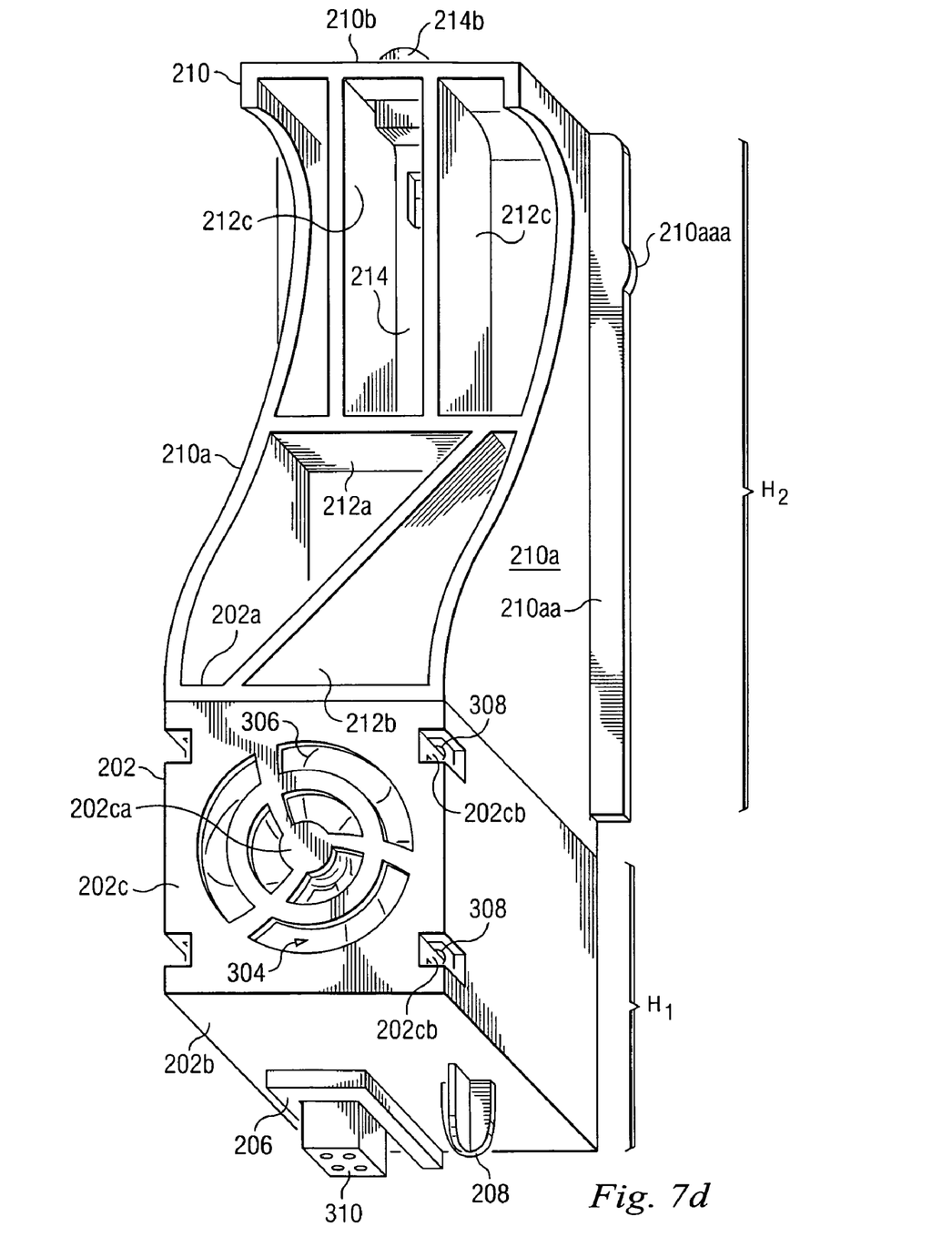
FIG. 7d is a front perspective view illustrating an embodiment of the fan module and the fan mounting apparatus of FIG. 7c.

Referring now to FIGS. 2a, 2b, 3, 7a, 7c, and 7d, the method 700 proceeds to step 704 where the fan mounting apparatus 200 with the fan module 300 is provided. The fan module 300 is positioned adjacent the base 202 of the fan mounting apparatus 200 such that the front surface 302a of the fan module 300 is adjacent the fan support slot 204. The fan module 300 may then be positioned in the fan support slot 204 such that each of the fan couplers 202cb engages a respective coupling aperture 308 on the fan module 300, securing the fan module 300 in the fan support slot 204, as illustrated in FIGS. 7c and 7d. The fan plug 310 is then coupled to the plug coupler 206 by positioning the plug mount 310a in the plug slot 206a, such that the fan plug extends from the bottom surface 202b of the base 202 of the fan mounting apparatus 200 and adjacent the alignment member 208. In an embodiment, the fan 306 may be operated to move air through the fan aperture 304 and the airflow passageway 202ca.

Figure 7E:
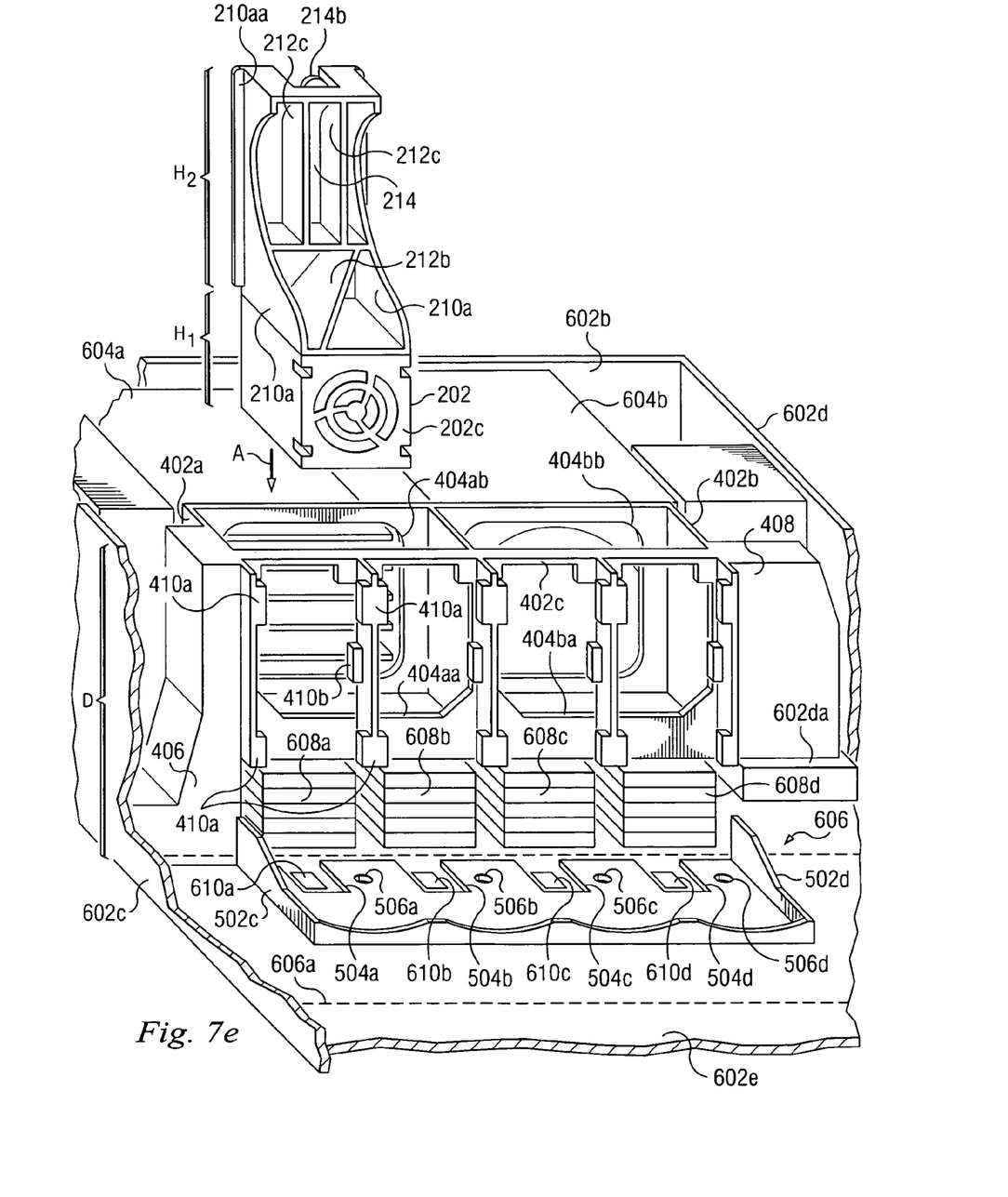
FIG. 7e is a perspective view illustrating an embodiment of the fan module and the fan mounting apparatus of FIG. 7d being coupled to the chassis, the first fan positioning feature, and second fan positioning feature of FIG. 7b.
Figure 7F:
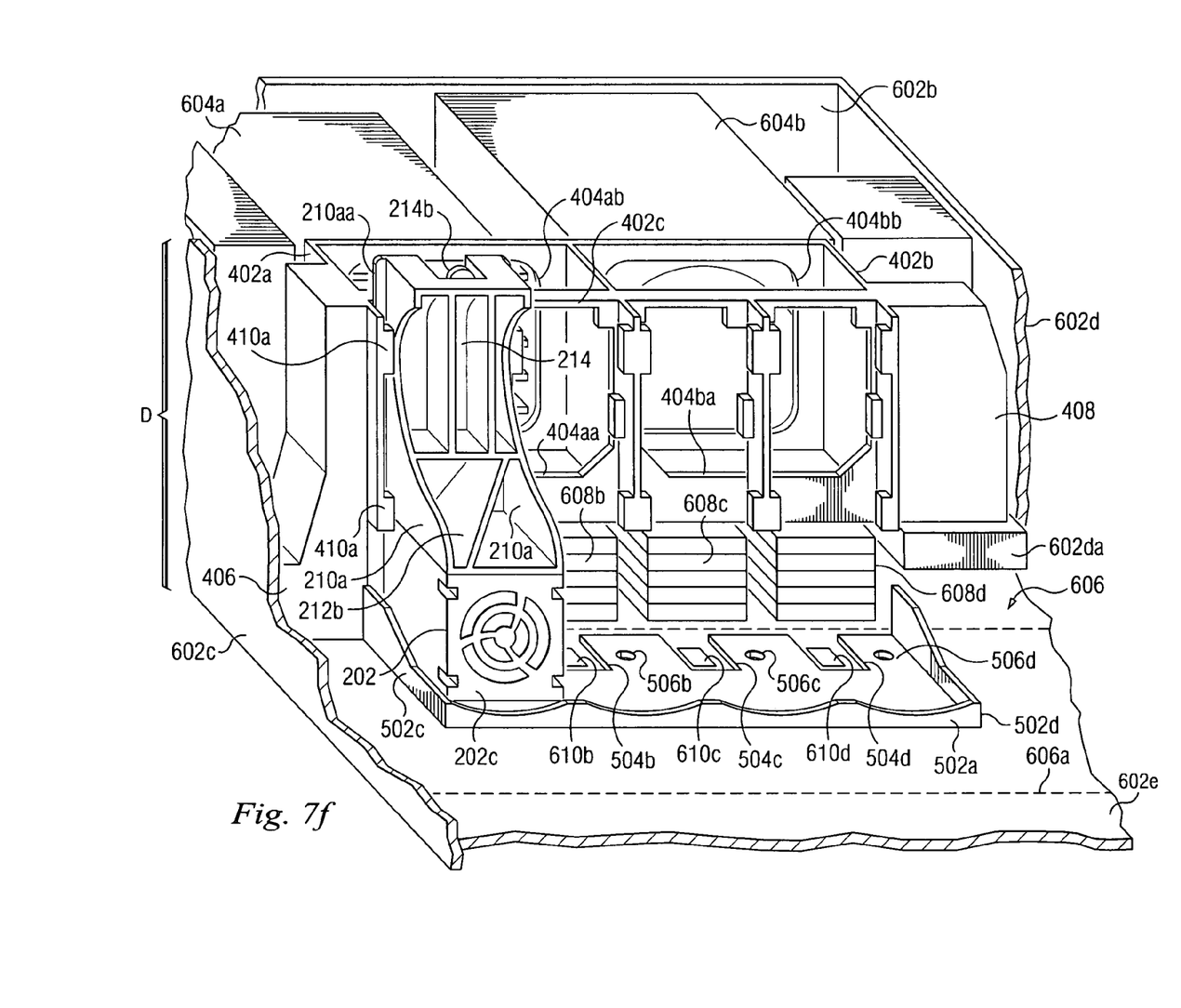
FIG. 7f is a perspective view illustrating an embodiment of the fan module and the fan mounting apparatus of FIG. 7d coupled to the chassis, the first fan positioning feature, and second fan positioning feature of FIG. 7b.
Figure 7G:
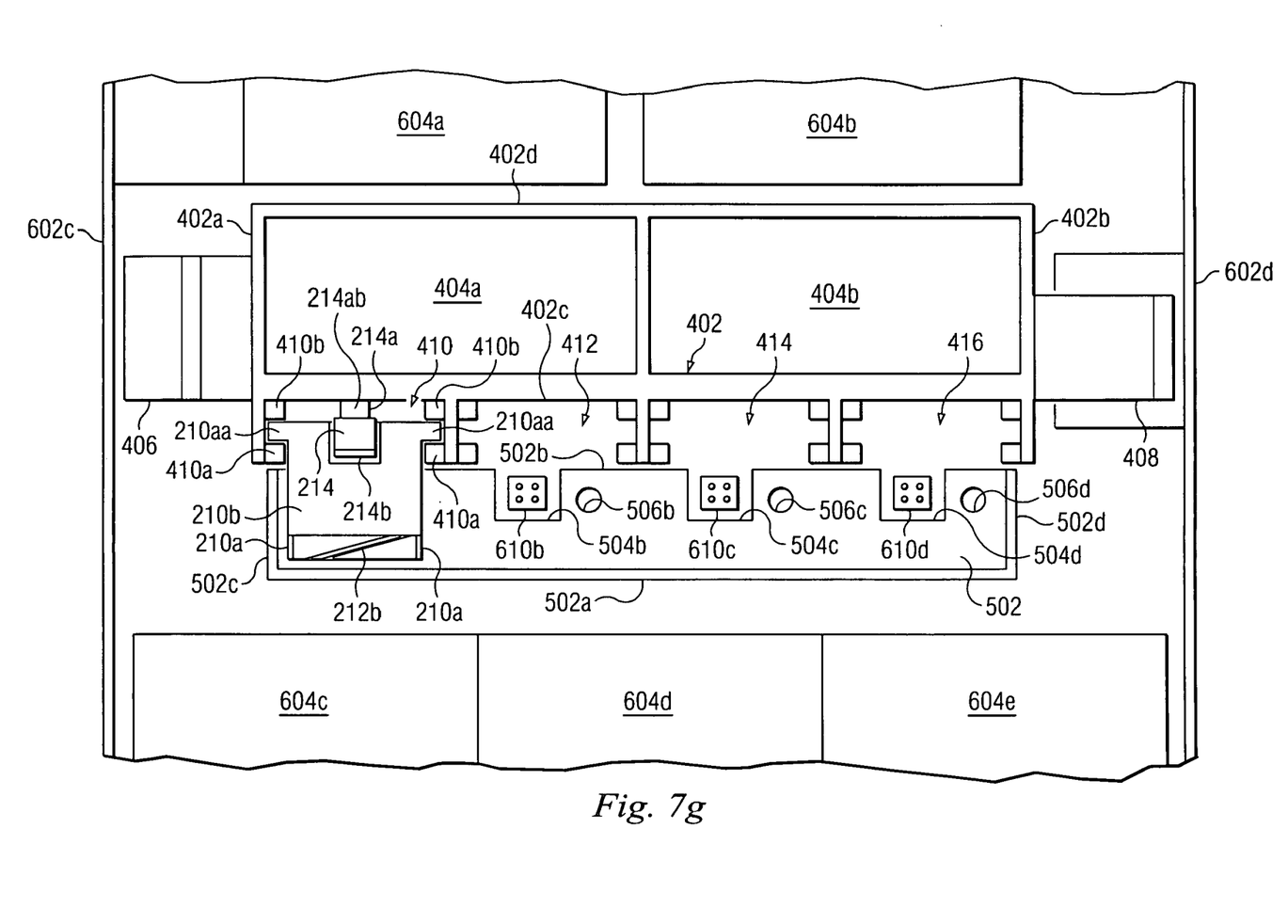
FIG. 7g is a top view illustrating an embodiment of the fan module and the fan mounting apparatus coupled to the chassis, the first fan positioning feature, and second fan positioning feature of FIG. 7f.
Figure 7H:
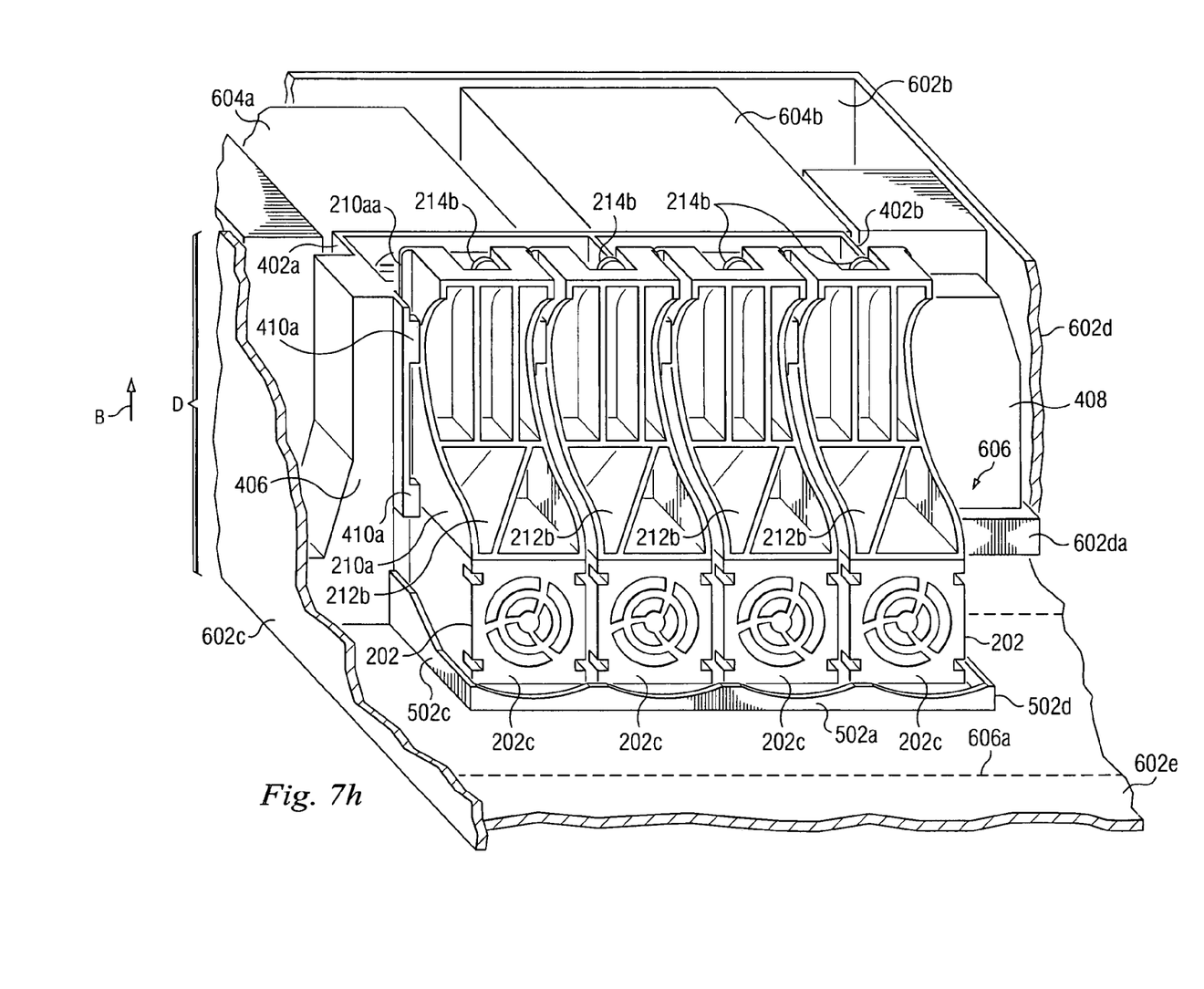
FIG. 7h is a perspective view illustrating an embodiment of a plurality of the fan module and the fan mounting apparatus of FIG. 7d coupled to the chassis, the first fan positioning feature, and second fan positioning feature of FIG. 7b.
Figure 7I:
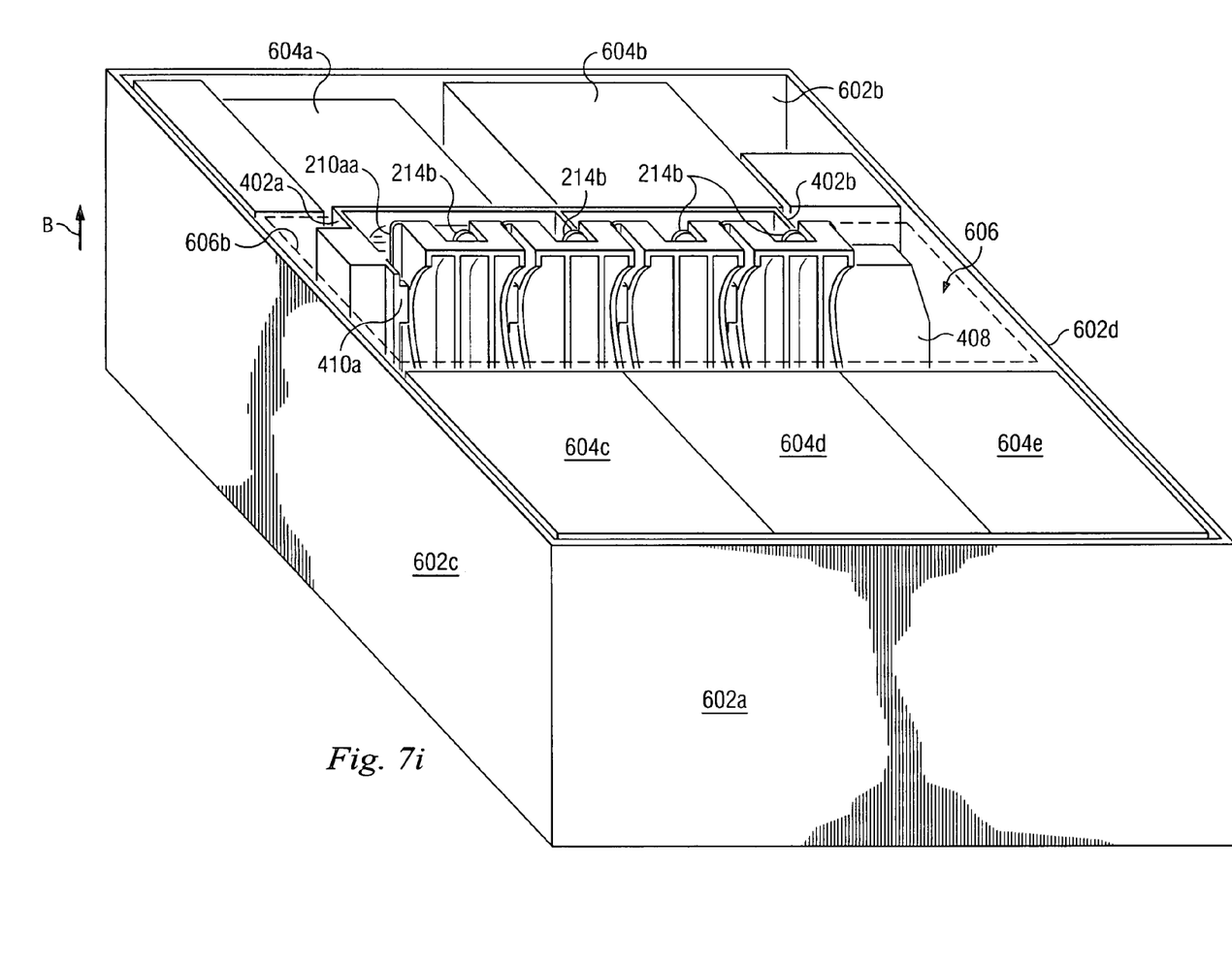
FIG. 7i is a perspective view illustrating an embodiment of a plurality of the fan module and the fan mounting apparatus of FIG. 7d coupled to the chassis, the first fan positioning feature, and second fan positioning feature of FIG. 7b.

Referring now to FIGS. 2a, 2b, 3, 4a, 4b, 5, 7a, 7c, 7d, 7e, 7f, and 7g, the method 700 proceeds to step 706 where the fan mounting apparatus 200 is mounted to the chassis 600. The fan mounting apparatus 200 with the fan module 300 coupled to it, illustrated in FIGS. 7c and 7d, is positioned adjacent the channel entrance 606b such that the bottom surface 202b of the base 202 on fan mounting apparatus 200 is adjacent the fan guide feature 410 on first fan positioning feature 400, as illustrated in FIG. 7e. The fan mounting apparatus 200 is then moved in a direction A such that the guide members 210aa on the arms 210a of the fan mounting apparatus 200 enter the guide channel 410c defined by the guide beams 410a and 410b, as illustrated in FIGS. 7f and 7g. With the guide members 210aa in the guide channel 410c, the fan module 300 may be guided into the fan channel 606 using the distal end 210b of the handle 210. As the fan mounting apparatus 200 approaches the channel bottom 606a, the alignment member 208 on the fan mounting apparatus 200 engages the fan alignment aperture 506a. The engagement of the alignment member 208 with the fan alignment aperture 506a lines up the fan plug 310 with the fan socket 610a. Continued movement of the fan mounting apparatus 200 in the direction A engages the fan plug 310 with the fan socket 610a and also results in the beveled surface 214aa on locking member 214a of securing member 214 engaging the front surface 402c of the first fan positioning feature 400. Engagement of the locking member 214a and the front surface 402c causes the securing member to deflect away from the front surface 402a such that the locking surface 214ab engages the front surface 402a, securing the fan mounting apparatus 200 to the chassis 600. Furthermore, the interference fit members 210aa on each guide member 210aa provides an interference fit between the fan mounting apparatus 200 and the first fan positioning member 400, providing a tight fit which reduces vibration of the fan mounting apparatus 200 in the chassis 600. With the fan mounting apparatus 200 secured to the chassis 600, the fan plug 310 is electrically coupled the fan socket 610a, as illustrated in FIGS. 7f and 7g. In an embodiment, a plurality of fan mounting apparatus 200 may be secured in fan guide features 412, 414, and 416 in the same manner as the fan mounting apparatus 200 was secured the fan guide feature 410, as illustrated in FIG. 7h. With the fan mounting apparatus 200 secured in the chassis 600, as illustrated in FIGS. 7h and 7i, distal ends 210b of the handles 210 are positioned adjacent the channel entrance 606b and the fan modules 300 are positioned adjacent the heat sinks 608a, 608b, 608c, and 608d. To remove a fan mounting apparatus 200, the release tab 214 may be deflected away from the front surface 402a such that the locking surface 214ab disengages the front surface 402a and the fan mounting apparatus 200 may be moved in a direction B and out of the fan channel 606 in chassis 600. Thus, a method and apparatus are provided which allow a fan module 300 to be mounted in and removed from a chassis 600 at the bottom of fan channel 606 safely, ergonomically, and without regard to visual obstructions.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An information handling system, comprising:
   a chassis defining a fan channel that extends from a channel entrance to a channel bottom;
   a microprocessor coupled to the chassis;
   a fan positioning feature located in the chassis adjacent the fan channel; and
   a fan assembly comprising:
      a base including a plug coupler slot, an alignment member and a fan coupler;
      a handle extending from the base and including a securing member, a release member, and a guide member having an interference fit member extending therefrom;
      a fan module engaged with the fan coupler and a plug having a slidable plug mount engaged with the plug coupler slot; and
      a chassis having a fan socket and a first alignment aperture and further comprising:
         a first fan positioning member having guide beams engaged with the guide member and the interference fit member, and having a surface engaged with the securing member; and
         a second fan positioning member having plug channels aligned with the fan socket and the plug, and having a second alignment aperture aligned with the first alignment aperture.

2. The system of claim 1, wherein the base defines an airflow passageway, and wherein the fan module is located adjacent the airflow passageway.

3. The system of claim 1, wherein the fan channel has a depth which is greater than approximately twice the height of the fan module.

4. The system of claim 1, further comprising:
   a heat sink coupled to the chassis and located adjacent the channel bottom, wherein the fan module is positioned adjacent the heat sink.

5. A fan assembly comprising:
   a base including a plug coupler slot, an alignment member and a fan coupler;
   a handle extending from the base and including a securing member, a release member, and a guide member having an interference fit member extending therefrom;
   a fan module engaged with the fan coupler and a plug having a slidable plug mount engaged with the plug coupler slot; and
   a chassis having a fan socket and a first alignment aperture and further comprising:
      a first fan positioning member having guide beams engaged with the guide member and the interference fit member, and having a surface engaged with the securing member; and
      a second fan positioning member having plug channels aligned with the fan socket and the plug, and having a second alignment aperture aligned with the first alignment aperture.

\* \* \* \* \*

UNITED STATES PATENT AND TRADEMARK OFFICE
CERTIFICATE OF CORRECTION

| | |
|---|---|
| PATENT NO. | : 7,623,344 B2 |
| APPLICATION NO. | : 11/199725 |
| DATED | : November 24, 2009 |
| INVENTOR(S) | : Beall et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 735 days.

Signed and Sealed this

Twenty-sixth Day of October, 2010

David J. Kappos
*Director of the United States Patent and Trademark Office*